(12) United States Patent
Su et al.

(10) Patent No.: US 7,962,863 B2
(45) Date of Patent: Jun. 14, 2011

(54) COMPUTER-IMPLEMENTED METHODS, SYSTEMS, AND COMPUTER-READABLE MEDIA FOR DETERMINING A MODEL FOR PREDICTING PRINTABILITY OF RETICLE FEATURES ON A WAFER

(75) Inventors: Bo Su, San Jose, CA (US); Gaurav Verma, Sunnyvale, CA (US); Hong Du, Saratoga, CA (US); Rui-fang Shi, Cupertino, CA (US); Scott Andrews, Mountain View, CA (US)

(73) Assignee: KLA-Tencor Corp., San Jose, CA (US)

( * ) Notice: Subject to any disclaimer, the term of this patent is extended or adjusted under 35 U.S.C. 154(b) by 522 days.

(21) Appl. No.: 12/115,830

(22) Filed: May 6, 2008
(Under 37 CFR 1.47)

(65) Prior Publication Data

US 2009/0024967 A1     Jan. 22, 2009

Related U.S. Application Data

(60) Provisional application No. 60/916,354, filed on May 7, 2007.

(51) Int. Cl.
G06F 17/50 (2006.01)
(52) U.S. Cl. ............................................ 716/50; 716/51
(58) Field of Classification Search ................ 716/50–56
See application file for complete search history.

(56) References Cited

U.S. PATENT DOCUMENTS

| | | | |
|---|---|---|---|
| 3,495,269 A | 2/1970 | Mutschler et al. |
| 3,496,352 A | 2/1970 | Jugle |
| 3,909,602 A | 9/1975 | Micka |
| 4,015,203 A | 3/1977 | Verkuil |
| 4,247,203 A | 1/1981 | Levy et al. |
| 4,347,001 A | 8/1982 | Levy et al. |
| 4,378,159 A | 3/1983 | Galbraith |
| 4,448,532 A | 5/1984 | Joseph et al. |

(Continued)

FOREIGN PATENT DOCUMENTS

EP          0032197          7/1981

(Continued)

OTHER PUBLICATIONS

Allan et al., "Critical Area Extraction for Soft Fault Estimation," IEEE Transactions on Semiconductor Manufacturing, vol. 11, No. 1, Feb. 1998.

(Continued)

*Primary Examiner* — Paul Dinh
(74) *Attorney, Agent, or Firm* — Ann Marie Mewherter (57) ABSTRACT

Computer-implemented methods, systems, and computer-readable media for determining a model for predicting printability of reticle features on a wafer are provided. One method includes generating simulated images of the reticle features printed on the wafer using different generated models for a set of different values of exposure conditions. The method also includes determining one or more characteristics of the reticle features of the simulated images. In addition, the method includes comparing the one or more characteristics of the reticle features of the simulated images to one or more characteristics of the reticle features printed on the wafer using a lithography process. The method further includes selecting one of the different generated models as the model to be used for predicting the printability of the reticle features based on results of the comparing step.

19 Claims, 3 Drawing Sheets

U.S. PATENT DOCUMENTS

| | | |
|---|---|---|
| 4,532,650 A | 7/1985 | Wihl et al. |
| 4,555,798 A | 11/1985 | Broadbent, Jr. et al. |
| 4,578,810 A | 3/1986 | MacFarlane et al. |
| 4,579,455 A | 4/1986 | Levy et al. |
| 4,595,289 A | 6/1986 | Feldman et al. |
| 4,599,558 A | 7/1986 | Castellano et al. |
| 4,633,504 A | 12/1986 | Wihl |
| 4,641,353 A | 2/1987 | Kobayashi |
| 4,641,967 A | 2/1987 | Pecan |
| 4,734,721 A | 3/1988 | Boyer et al. |
| 4,758,094 A | 7/1988 | Wihl |
| 4,766,324 A | 8/1988 | Saadat et al. |
| 4,799,175 A | 1/1989 | Sano et al. |
| 4,805,123 A | 2/1989 | Specht et al. |
| 4,812,756 A | 3/1989 | Curtis et al. |
| 4,814,829 A | 3/1989 | Kosugi et al. |
| 4,817,123 A | 3/1989 | Sones et al. |
| 4,845,558 A | 7/1989 | Tsai et al. |
| 4,877,326 A | 10/1989 | Chadwick et al. |
| 4,926,489 A | 5/1990 | Danielson et al. |
| 4,928,313 A | 5/1990 | Leonard et al. |
| 5,046,109 A | 9/1991 | Fujimori et al. |
| 5,189,481 A | 2/1993 | Jann et al. |
| 5,444,480 A | 8/1995 | Sumita |
| 5,453,844 A | 9/1995 | George et al. |
| 5,481,624 A | 1/1996 | Kamon |
| 5,485,091 A | 1/1996 | Verkuil |
| 5,528,153 A | 6/1996 | Taylor et al. |
| 5,544,256 A | 8/1996 | Brecher et al. |
| 5,563,702 A | 10/1996 | Emery et al. |
| 5,572,598 A | 11/1996 | Wihl et al. |
| 5,578,821 A | 11/1996 | Meisberger et al. |
| 5,594,247 A | 1/1997 | Verkuil et al. |
| 5,608,538 A | 3/1997 | Edger et al. |
| 5,619,548 A | 4/1997 | Koppel |
| 5,621,519 A | 4/1997 | Frost et al. |
| 5,644,223 A | 7/1997 | Verkuil |
| 5,650,731 A | 7/1997 | Fung |
| 5,661,408 A | 8/1997 | Kamieniecki et al. |
| 5,689,614 A | 11/1997 | Gronet et al. |
| 5,694,478 A | 12/1997 | Braier et al. |
| 5,696,835 A | 12/1997 | Hennessey et al. |
| 5,703,969 A | 12/1997 | Hennessey et al. |
| 5,737,072 A | 4/1998 | Emery et al. |
| 5,742,658 A | 4/1998 | Tiffin et al. |
| 5,754,678 A | 5/1998 | Hawthorne et al. |
| 5,767,691 A | 6/1998 | Verkuil |
| 5,767,693 A | 6/1998 | Verkuil |
| 5,771,317 A | 6/1998 | Edgar |
| 5,773,989 A | 6/1998 | Edelman et al. |
| 5,774,179 A | 6/1998 | Chevrette et al. |
| 5,795,685 A | 8/1998 | Liebmann et al. |
| 5,834,941 A | 11/1998 | Verkuil |
| 5,852,232 A | 12/1998 | Samsavar et al. |
| 5,866,806 A | 2/1999 | Samsavar et al. |
| 5,874,733 A | 2/1999 | Silver et al. |
| 5,884,242 A | 3/1999 | Meier et al. |
| 5,889,593 A | 3/1999 | Bareket |
| 5,932,377 A | 8/1999 | Ferguson et al. |
| 5,940,458 A | 8/1999 | Suk |
| 5,948,972 A | 9/1999 | Samsavar et al. |
| 5,955,661 A | 9/1999 | Samsavar et al. |
| 5,965,306 A | 10/1999 | Mansfield et al. |
| 5,980,187 A | 11/1999 | Verhovsky |
| 5,986,263 A | 11/1999 | Hiroi et al. |
| 5,991,699 A | 11/1999 | Kulkarni et al. |
| 6,011,404 A | 1/2000 | Ma et al. |
| 6,014,461 A | 1/2000 | Hennessey et al. |
| 6,052,478 A | 4/2000 | Wihl et al. |
| 6,060,709 A | 5/2000 | Verkuil et al. |
| 6,072,320 A | 6/2000 | Verkuil |
| 6,076,465 A | 6/2000 | Vacca et al. |
| 6,078,738 A | 6/2000 | Garza et al. |
| 6,091,257 A | 7/2000 | Verkuil et al. |
| 6,091,846 A | 7/2000 | Lin et al. |
| 6,097,196 A | 8/2000 | Verkuil et al. |
| 6,097,887 A | 8/2000 | Hardikar et al. |
| 6,104,206 A | 8/2000 | Verkuil |
| 6,104,835 A | 8/2000 | Han |
| 6,121,783 A | 9/2000 | Horner et al. |
| 6,122,017 A | 9/2000 | Taubman |
| 6,122,046 A | 9/2000 | Almogy |
| 6,137,570 A | 10/2000 | Chuang et al. |
| 6,141,038 A | 10/2000 | Young et al. |
| 6,146,627 A | 11/2000 | Muller |
| 6,171,737 B1 | 1/2001 | Phan et al. |
| 6,175,645 B1 | 1/2001 | Elyasaf et al. |
| 6,184,929 B1 | 2/2001 | Noda et al. |
| 6,184,976 B1 | 2/2001 | Park et al. |
| 6,191,605 B1 | 2/2001 | Miller et al. |
| 6,201,999 B1 | 3/2001 | Jevtic |
| 6,202,029 B1 | 3/2001 | Verkuil et al. |
| 6,205,239 B1 | 3/2001 | Lin et al. |
| 6,224,638 B1 | 5/2001 | Jevtic et al. |
| 6,233,719 B1 | 5/2001 | Hardikar et al. |
| 6,248,485 B1 | 6/2001 | Cuthbert |
| 6,248,486 B1 | 6/2001 | Dirksen et al. |
| 6,259,960 B1 | 7/2001 | Inokuchi |
| 6,266,437 B1 | 7/2001 | Elchel et al. |
| 6,267,005 B1 | 7/2001 | Samsavar et al. |
| 6,268,093 B1 | 7/2001 | Kenan et al. |
| 6,272,236 B1 | 8/2001 | Pierrat et al. |
| 6,282,309 B1 | 8/2001 | Emery |
| 6,292,582 B1 | 9/2001 | Lin et al. |
| 6,324,298 B1 | 11/2001 | O'Dell et al. |
| 6,344,640 B1 | 2/2002 | Rhoads |
| 6,363,166 B1 | 3/2002 | Wihl et al. |
| 6,373,975 B1 | 4/2002 | Bula et al. |
| 6,415,421 B2 | 7/2002 | Anderson et al. |
| 6,445,199 B1 | 9/2002 | Satya et al. |
| 6,451,690 B1 | 9/2002 | Matsumoto |
| 6,459,520 B1 | 10/2002 | Takayama |
| 6,466,314 B1 | 10/2002 | Lehman |
| 6,466,315 B1 | 10/2002 | Karpol et al. |
| 6,470,489 B1 | 10/2002 | Chang et al. |
| 6,483,938 B1 | 11/2002 | Hennessey et al. |
| 6,513,151 B1 | 1/2003 | Erhardt et al. |
| 6,526,164 B1 | 2/2003 | Mansfield et al. |
| 6,529,621 B1 | 3/2003 | Glasser et al. |
| 6,535,628 B2 | 3/2003 | Smargiassi et al. |
| 6,539,106 B1 | 3/2003 | Gallarda et al. |
| 6,569,691 B1 | 5/2003 | Jastrzebski et al. |
| 6,581,193 B1 | 6/2003 | McGhee et al. |
| 6,593,748 B1 | 7/2003 | Halliyal et al. |
| 6,597,193 B2 | 7/2003 | Lagowski et al. |
| 6,602,728 B1 | 8/2003 | Liebmann et al. |
| 6,608,681 B2 | 8/2003 | Tanaka et al. |
| 6,614,520 B1 | 9/2003 | Baraket et al. |
| 6,631,511 B2 | 10/2003 | Haffner |
| 6,636,301 B1 | 10/2003 | Kvamme et al. |
| 6,642,066 B1 | 11/2003 | Halliyal et al. |
| 6,658,640 B2 | 12/2003 | Weed |
| 6,665,065 B1 | 12/2003 | Phan et al. |
| 6,670,082 B2 | 12/2003 | Liu et al. |
| 6,680,621 B2 | 1/2004 | Savtchouk et al. |
| 6,691,052 B1 | 2/2004 | Maurer |
| 6,701,004 B1 | 3/2004 | Shykind et al. |
| 6,718,526 B1 | 4/2004 | Eldredge et al. |
| 6,721,695 B1 | 4/2004 | Chen et al. |
| 6,734,696 B2 | 5/2004 | Horner et al. |
| 6,748,103 B2 | 6/2004 | Glasser |
| 6,751,519 B1 | 6/2004 | Satya et al. |
| 6,753,954 B2 | 6/2004 | Chen |
| 6,757,645 B2 | 6/2004 | Chang |
| 6,771,806 B1 | 8/2004 | Satya et al. |
| 6,775,818 B2 | 8/2004 | Taravade et al. |
| 6,777,147 B1 | 8/2004 | Fonseca et al. |
| 6,777,676 B1 | 8/2004 | Wang et al. |
| 6,778,695 B1 | 8/2004 | Schellenberg et al. |
| 6,779,159 B2 | 8/2004 | Yokoyama et al. |
| 6,784,446 B1 | 8/2004 | Phan et al. |
| 6,788,400 B2 | 9/2004 | Chen |
| 6,789,032 B2 | 9/2004 | Barbour et al. |
| 6,803,554 B2 | 10/2004 | Ye et al. |
| 6,806,456 B1 | 10/2004 | Ye et al. |
| 6,807,503 B2 | 10/2004 | Ye et al. |
| 6,813,572 B2 | 11/2004 | Satya et al. |

| | | |
|---|---|---|
| 6,820,028 B2 | 11/2004 | Ye et al. |
| 6,828,542 B2 | 12/2004 | Ye et al. |
| 6,842,225 B1 | 1/2005 | Irie |
| 6,859,746 B1 | 2/2005 | Stirton |
| 6,879,924 B2 | 4/2005 | Ye et al. |
| 6,882,745 B2 | 4/2005 | Brankner |
| 6,884,984 B2 | 4/2005 | Ye et al. |
| 6,886,153 B1 | 4/2005 | Bevis |
| 6,892,156 B2 | 5/2005 | Ye et al. |
| 6,902,855 B2 | 6/2005 | Peterson et al. |
| 6,906,305 B2 | 6/2005 | Pease et al. |
| 6,918,101 B1 | 7/2005 | Satya et al. |
| 6,948,141 B1 | 9/2005 | Satya et al. |
| 6,959,255 B2 | 10/2005 | Ye et al. |
| 6,966,047 B1 | 11/2005 | Glasser |
| 6,969,837 B2 | 11/2005 | Ye et al. |
| 6,969,864 B2 | 11/2005 | Ye et al. |
| 6,983,060 B1 | 1/2006 | Martinent-Catalot et al. |
| 6,988,045 B2 | 1/2006 | Purdy |
| 7,003,755 B2 | 2/2006 | Pang et al. |
| 7,003,758 B2 | 2/2006 | Ye et al. |
| 7,012,438 B1 | 3/2006 | Miller et al. |
| 7,026,615 B2 | 4/2006 | Takane et al. |
| 7,027,143 B1 | 4/2006 | Stokowski et al. |
| 7,030,966 B2 | 4/2006 | Hansen |
| 7,030,997 B2 | 4/2006 | Neureuther et al. |
| 7,053,355 B2 | 5/2006 | Ye et al. |
| 7,061,625 B1 | 6/2006 | Hwang |
| 7,103,484 B1 | 9/2006 | Shi et al. |
| 7,106,895 B1 | 9/2006 | Goldberg et al. |
| 7,107,517 B1 | 9/2006 | Suzuki et al. |
| 7,107,571 B2 | 9/2006 | Chang et al. |
| 7,111,277 B2 | 9/2006 | Ye et al. |
| 7,114,145 B2 | 9/2006 | Ye et al. |
| 7,117,477 B2 | 10/2006 | Ye et al. |
| 7,117,478 B2 | 10/2006 | Ye et al. |
| 7,120,285 B1 | 10/2006 | Spence |
| 7,120,895 B2 | 10/2006 | Ye et al. |
| 7,123,356 B1 | 10/2006 | Stokowski |
| 7,124,386 B2 | 10/2006 | Smith |
| 7,133,548 B2 | 11/2006 | Kenan et al. |
| 7,135,344 B2 | 11/2006 | Nehmadi |
| 7,136,143 B2 | 11/2006 | Smith |
| 7,152,215 B2 | 12/2006 | Smith |
| 7,171,334 B2 | 1/2007 | Gassner |
| 7,174,520 B2 | 2/2007 | White |
| 7,194,709 B2 | 3/2007 | Brankner |
| 7,207,017 B1 | 4/2007 | Tabery et al. |
| 7,231,628 B2 | 6/2007 | Pack et al. |
| 7,236,847 B2 | 6/2007 | Marella |
| 7,379,175 B1 | 5/2008 | Stokowski et al. |
| 7,386,839 B1 | 6/2008 | Golender et al. |
| 7,418,124 B2 | 8/2008 | Peterson et al. |
| 7,424,145 B2 | 9/2008 | Horie et al. |
| 2001/0019625 A1 | 9/2001 | Kenan et al. |
| 2001/0022858 A1 | 9/2001 | Komiya et al. |
| 2001/0043735 A1 | 11/2001 | Smargiassi et al. |
| 2002/0019729 A1 | 2/2002 | Chang et al. |
| 2002/0026626 A1 | 2/2002 | Randall et al. |
| 2002/0033449 A1 | 3/2002 | Nakasuji et al. |
| 2002/0035461 A1 | 3/2002 | Chang et al. |
| 2002/0035641 A1 | 3/2002 | Kurose |
| 2002/0088951 A1 | 7/2002 | Chen |
| 2002/0090746 A1 | 7/2002 | Xu et al. |
| 2002/0134936 A1 | 9/2002 | Matsui et al. |
| 2002/0144230 A1 | 10/2002 | Rittman |
| 2002/0164065 A1 | 11/2002 | Cai et al. |
| 2002/0181756 A1 | 12/2002 | Shibuya et al. |
| 2002/0186878 A1 | 12/2002 | Hoon et al. |
| 2002/0192578 A1 | 12/2002 | Tanaka et al. |
| 2003/0014146 A1 | 1/2003 | Fujii |
| 2003/0022401 A1 | 1/2003 | Hamamatsu et al. |
| 2003/0033046 A1 | 2/2003 | Yoshitake et al. |
| 2003/0048458 A1 | 3/2003 | Mieher |
| 2003/0048939 A1 | 3/2003 | Lehman |
| 2003/0057971 A1 | 3/2003 | Nishiyama et al. |
| 2003/0086081 A1 | 5/2003 | Lehman |
| 2003/0098805 A1 | 5/2003 | Bizjak |
| 2003/0128870 A1 | 7/2003 | Pease et al. |
| 2003/0138138 A1 | 7/2003 | Vacca et al. |
| 2003/0138978 A1 | 7/2003 | Tanaka et al. |
| 2003/0169916 A1 | 9/2003 | Hayashi et al. |
| 2003/0207475 A1 | 11/2003 | Nakasuji et al. |
| 2003/0223639 A1 | 12/2003 | Shlain et al. |
| 2003/0226951 A1 | 12/2003 | Ye et al. |
| 2003/0228714 A1 | 12/2003 | Smith |
| 2003/0229410 A1 | 12/2003 | Smith |
| 2003/0229412 A1 | 12/2003 | White |
| 2003/0229868 A1 | 12/2003 | White |
| 2003/0229875 A1 | 12/2003 | Smith |
| 2003/0229880 A1 | 12/2003 | White |
| 2003/0229881 A1 | 12/2003 | White |
| 2003/0237064 A1 | 12/2003 | White et al. |
| 2004/0030430 A1 | 2/2004 | Matsuoka |
| 2004/0032908 A1 | 2/2004 | Hagai et al. |
| 2004/0052411 A1 | 3/2004 | Qian et al. |
| 2004/0057611 A1 | 3/2004 | Lee et al. |
| 2004/0091142 A1 | 5/2004 | Peterson et al. |
| 2004/0098216 A1 | 5/2004 | Ye et al. |
| 2004/0102934 A1 | 5/2004 | Chang |
| 2004/0107412 A1 | 6/2004 | Pack et al. |
| 2004/0119036 A1 | 6/2004 | Ye et al. |
| 2004/0133369 A1 | 7/2004 | Pack et al. |
| 2004/0174506 A1 | 9/2004 | Smith |
| 2004/0223639 A1 | 11/2004 | Sato et al. |
| 2004/0228515 A1 | 11/2004 | Okabe et al. |
| 2004/0243320 A1 | 12/2004 | Chang et al. |
| 2005/0004774 A1 | 1/2005 | Volk et al. |
| 2005/0008218 A1 | 1/2005 | O'Dell et al. |
| 2005/0010890 A1 | 1/2005 | Nehmadi et al. |
| 2005/0062962 A1 | 3/2005 | Fairley |
| 2005/0117796 A1 | 6/2005 | Matsui et al. |
| 2005/0132306 A1 | 6/2005 | Smith |
| 2005/0166174 A1 | 7/2005 | Ye et al. |
| 2005/0190957 A1 | 9/2005 | Cai et al. |
| 2005/0198602 A1 | 9/2005 | Brankner |
| 2006/0000964 A1 | 1/2006 | Ye et al. |
| 2006/0048089 A1 | 3/2006 | Schwarzbaned |
| 2006/0051682 A1 | 3/2006 | Hess et al. |
| 2006/0062445 A1 | 3/2006 | Verma et al. |
| 2006/0082763 A1 | 4/2006 | The et al. |
| 2006/0159333 A1 | 7/2006 | Ishikawa |
| 2006/0161452 A1 | 7/2006 | Hess et al. |
| 2006/0193506 A1 | 8/2006 | Dorphan et al. |
| 2006/0193507 A1 | 8/2006 | Sali et al. |
| 2006/0236294 A1 | 10/2006 | Saidin |
| 2006/0236297 A1 | 10/2006 | Melvin et al. |
| 2006/0265145 A1 | 11/2006 | Huet et al. |
| 2006/0269120 A1 | 11/2006 | Nehmadi et al. |
| 2006/0273242 A1 | 12/2006 | Hunsche et al. |
| 2006/0273266 A1 | 12/2006 | Preil et al. |
| 2006/0291714 A1 | 12/2006 | Wu et al. |
| 2006/0292463 A1 | 12/2006 | Best et al. |
| 2007/0002322 A1 | 1/2007 | Borodovsky et al. |
| 2007/0019171 A1 | 1/2007 | Smith |
| 2007/0031745 A1 | 2/2007 | Ye et al. |
| 2007/0032896 A1 | 2/2007 | Ye et al. |
| 2007/0035712 A1 | 2/2007 | Gassner et al. |
| 2007/0035728 A1 | 2/2007 | Kekare et al. |
| 2007/0052963 A1 | 3/2007 | Orbon |
| 2007/0064995 A1 | 3/2007 | Oaki et al. |
| 2007/0133860 A1 | 6/2007 | Lin |
| 2007/0156379 A1 | 7/2007 | Kulkarni et al. |
| 2007/0230770 A1 | 10/2007 | Kulkarni et al. |
| 2007/0288219 A1 | 12/2007 | Zafar et al. |
| 2008/0013083 A1 | 1/2008 | Kirk et al. |
| 2008/0049994 A1 | 2/2008 | Rognin et al. |
| 2008/0072207 A1* | 3/2008 | Verma et al. ............ 716/21 |
| 2008/0163140 A1 | 7/2008 | Fouquet et al. |
| 2008/0167829 A1 | 7/2008 | Park et al. |

FOREIGN PATENT DOCUMENTS

| | | |
|---|---|---|
| EP | 0370322 | 5/1990 |
| EP | 1061358 | 12/2000 |
| EP | 1061571 | 12/2000 |
| EP | 1065567 | 1/2001 |
| EP | 1066925 | 1/2001 |
| EP | 1069609 | 1/2001 |

| | | |
|---|---|---|
| EP | 1093017 | 4/2001 |
| EP | 1480034 | 11/2004 |
| EP | 1696270 | 8/2006 |
| JP | 2002-071575 | 3/2002 |
| KR | 1020030055848 | 7/2003 |
| WO | WO 98/57358 | 12/1998 |
| WO | WO 99/22310 | 5/1999 |
| WO | WO 99/25004 | 5/1999 |
| WO | WO 99/38002 | 7/1999 |
| WO | WO 99/41434 | 8/1999 |
| WO | WO 99/59200 | 11/1999 |
| WO | WO 00/03234 | 1/2000 |
| WO | WO 00/36525 | 6/2000 |
| WO | WO 00/55799 | 9/2000 |
| WO | WO 00/68884 | 11/2000 |
| WO | WO 00/70332 | 11/2000 |
| WO | WO 01/09566 | 2/2001 |
| WO | WO 01/40145 | 6/2001 |
| WO | WO 03/104921 | 12/2003 |
| WO | WO 2004/027684 | 4/2004 |
| WO | WO 2006/063268 | 6/2006 |

OTHER PUBLICATIONS

Barty et al., "Aerial Image Microscopes for the inspection of defects in EUV masks," Proceedings of SPIE, vol. 4889, 2002, pp. 1073-1084.

Budd et al., "A New Mask Evaluation Tool, the Microlithography Simulation Microscope Aerial Image Measurement System," SPIE vol. 2197, 1994, pp. 530-540.

Cai et al., "Enhanced Dispositioning of Reticle Defects Using the Virtual Stepper With Automoated Defect Severity Scoring," Proceedings of the SPIE, vol. 4409, Jan. 2001, pp. 467-478.

Comizzoli, "Uses of Corono Discharges in the Semiconfuctor Industry," J. Electrochem. Soc., 1987, pp. 424-429.

Contactless Electrical Equivalent Oxide Thickness Measurement, IBM Technical Disclosure Bulletin, vol. 29, No. 10, 1987, pp. 4622-4623.

Contactless Photovoltage vs. Bias Method for Determining Flat-Band Voltage, IBM Technical Disclosure Bulletin, vol. 32, vol. 9A, 1990, pp. 14-17.

Cosway et al., "Manufacturing Implementation of Corona Oxide Silicon (COS) Systems for Diffusion Furnace Contamination Monitoring," 1997 IEEE/SEMI Advanced Semiconductor Manufacturing Conference, pp. 98-102.

Diebold et al., "Characterization and produiction metrology of thin transistor gate oxide films," Materials Science in Semiconductor Processing 2, 1999, pp. 103-147.

Dirksen et al., "Impact of high order aberrations on the performance of the aberration monitor," Proc. Of SPIE vol. 4000, Mar. 2000, pp. 9-17.

Dirksen et al,, "Novel aberration monitor for optical lithography," Proc. Of SPIE vol. 3679, Jul. 1999, pp. 77-86.

Garcia et al., "New Die to Database Inspection Algorithm for Inspection of 90-nm Node Reticles," Proceedings of SPIE, vol. 5130, 2003, pp. 364-374.

Granik et al., "Sub-resolution process windows and yield estimation technique based on detailed full-chip CD simulation," Mentor Graphics, Sep. 2000, 5 pages.

Hess et al., "A Novel Approach: High Resolution Inspection with Wafer Plane Defect Detection," Proceedings of SPIE—International Society for Optical Engineering; Photomask and Next-Generation Lithography Mask Technology 2008, vol. 7028, 2008.

Huang et al., "Process Window Impact of Progressive Mask Defects, Its Inspection and Disposition Techniques (go/no-go criteria) Via a Lithographic Detector," Proceedings of SPIE—The International Society for Optical Engineering; 25th Annual Bacus Symposium on Photomask Technology 2005, vol. 5992.

Hung et al., Metrology Study of Sub 20 Angstrom oxynitride by Corona-Oxide-Silicon (COS) and Conventional C-V Approaches, 2002, Mat. Res. Soc. Symp. Proc., vol. 716, pp. 119-124.

International Search Report for PCT/US2003/21907 mailed Jun. 7, 2004.

International Search Report for PCT/US2004/040733 mailed Dec. 23, 2005.

International Search Report and Written Opinion for PCT Appln. No. PCT/US08/050397 dated Jul. 11, 2008.

International Search Report and Written Opinion for PCT Appln. No. PCT/US06/61113 dated Jul. 16, 2008.

International Search Report and Written Opinion for PCT/US2008/062873 mailed Aug. 12, 2008.

International Search Report and Written Opinion for PCT Appln. No. PCT/US2008/063008 dated Aug. 18, 2008.

International Search Report for PCT/US2008/62875 mailed Sep. 10, 2008.

International Search Report and Written Opinion for PCT Appln. No. PCT/US06/61112 dated Sep. 25, 2008.

International Search Report for PCT/US2008/70647 mailed Dec. 16, 2008.

Karklin et al., "Automatic Defect Severity Scoring for 193 nm Reticle Defect Inspection," Proceedings of SPIE—The International Society for Optical Engineering, 2001, vol. 4346, No. 2, pp. 898-906.

Lo et al., "Identifying Process Window Marginalities of Reticle Designs for 0.15/0.13 μm Technologies," Proceedings of SPIE vol. 5130, 2003, pp. 829-837.

Lorusso et al. "Advanced DFM Applns. Using design-based metrology on CDSEM," SPIE vol. 6152, Mar. 27, 2006.

Lu et al., "Application of Simulation Based Defect Printability Analysis for Mask Qualification Control," Proceedings of SPIE, vol. 5038, 2003, pp. 33-40.

Mack, "Lithographic Simulation: A Review," Proceedings of SPIE vol. 4440, 2001, pp. 59-72.

Martino et al., "Application of the Aerial Image Measurement System (AIMS(TM)) to the Analysis of Binary Mask Imaging and Resolution Enhancement Techniques," SPIE vol. 2197, 1994, pp. 573-584.

Miller, "A New Approach for Measuring Oxide Thickness," Semiconductor International, Jul. 1995, pp. 147-148.

Nagpal et al., "Wafer Plane Inspection for Advanced Reticle Defects," Proceedings of SPIE—The International Society for Optical Engineering; Photomask and Next-Generation Lithography Mask Technology. vol. 7028, 2008.

Numerical Recipes in C. The Art of Scientific Computing, 2nd Ed., © Cambridge University Press 1988, 1992, p. 683.

Otsu, "A Threshold Selection Method from Gray-Level Histograms," IEEE Transactions on Systems, Man, and Cybernetics, vol. SMC-9, No. 1, Jan. 1979, pp. 62-66.

Pang et al., "Simulation-based Defect Printability Analysis on Alternating Phase Shifting Masks for 193 nm Lithography," Proceedings of SPIE, vol. 4889, 2002, pp. 947-954.

Pettibone et al., "Wafer Printability Simulation Accuracy Based on UV Optical Inspection Images of Reticle Defects," Proceedings of SPIE—The International Society for Optical Engineering 1999 Society of Photo-Optical Instrumentation Engineers, vol. 3677, No. II, 1999, pp. 711-720.

Phan et al., "Comparison of Binary Mask Defect Printability Analysis Using Virtual Stepper System and Aerial Image Microscope System," Proceedings of SPIE—The International Society for Optical Engineering 1999 Society of Photo-Optical Instrumentation Engineers, vol. 3873, 1999, pp. 681-692.

Sahouria et al., "Full-chip Process Simulation for Silicon DRC," Mentor Graphics, Mar. 2000, 6 pages.

Schroder et al., Corono-Oxide-Semiconductor Device Characterization, 1998, Solid-State Electronics, vol. 42, No. 4, pp, 505-512.

Schroder, "Surface voltage and surface photovoltage: history, theory and applications," Measurement Science and Technology, vol. 12, 2001, pp. R16-31.

Schroder, Contactless Surface Charge Semiconductor Characterization, Apr. 2002, Materials Science and Engineering B, vol. 91-92, pp. 196-228.

Schurz et al., "Simulation Study of Reticle Enhancement Technology Applications for 157 nm Lithography," SPIE vol. 4562, 2002, pp. 902-913.

Svidenko et al. "Dynamic Defect-Limited Yield Prediction by Criticality Factor," ISSM Paper: YE-O-157, 2007.

U.S. Appl. No. 10/677,445 (Horner et al.) entitled Methods for Non-Contacting Differential Voltage Measurements filed Oct. 2, 2003.

U.S. Appl. No. 10/778,752 (Mack et al.) entitled Methods for Improved Monitor and Control of Lithography Processes filed Feb. 13, 2004.

U.S. Appl. No. 11/154,310 (Verma et al.) entitled Computer-Implemented Methods, Simulation Engines and Systems for filed Jun. 16, 2005.

U.S. Appl. No. 11/830,485 (Kulkarni et al.) entitled Semiconductor Device Property Extraction, Generation, Visualization, and Monitoring Methods filed Jul. 30, 2007.

U.S. Appl. No. 11/837,208 (Park et al.) entitled Computer-Implemented Methods, Carrier Media, and Systems for Generating a Metrology Sampling Plan filed Aug. 10, 2007.

U.S. Appl. No. 11/960,157 (Duffy et al.) entitled Systems and Methodsfor Creating Inspection Recipes filed Dec. 19, 2007.

U.S. Appl. No. 12/102,343 (Chen et al.) entitled Methods and Systems for Determining a Defect Criticality Index for Defects on Wafers filed Apr. 14, 2008.

U.S. Appl. No. 12/115,833 (Alles et al.) entitled Methods for Detecting and Classifying Defects on a Reticle filed May 6, 2008.

U.S. Appl. No. 12/116,664 (Peterson et al.) entitled Methods and Systems for Detecting Defects in a Reticle Design Pattern filed May 7, 2008.

U.S. Appl. No. 12/195,024 (Florence et al.) entitled Computer-Implemented Methods for Determining if Actual Defects are Potentially Systematic Defects or Potentially Random Defects filed Aug. 20, 2008.

U.S. Appl. No. 12/176,095 (Bhaskar et al.) entitled Methods for Generating a Standard Reference Die for Use in a Die to Standard Reference Die Inspection and Methods for Inspecting a Wafer filed Jul. 18, 2008.

U.S. Appl. No. 60/418,887 (Su et al.) entitled Methods and Systems for Inspecting Reticles Using Aerial Imaging and Die-To-Database Detection filed Oct. 15, 2002.

U.S. Appl. No. 60/418,994 (Stokowski et al.) entitled Methods and Systems for Reticle Inspection and Defect Review Using Aerial Imaging filed Oct. 15, 2002.

U.S. Appl. No. 60/419,028 (Stokowski et al.) entitled Methods and Systems for Inspecting Reticles Using Aerial Imaging at Off-Stepper Wavelengths filed Oct. 15, 2002.

U.S. Appl. No. 60/451,707 (Howard et al.) entitled Methods and Systems for Classifying and Analyzing Defects on Reticles filed Mar. 4, 2003.

U.S. Appl. No. 60/526,881 (Hess et al.) entitled Designer Intent filed Dec. 4, 2003.

U.S. Appl. No. 60/609,670 (Preil et al.) entitled Methods, Systems, and Carrier Media for Evaluating Reticle Layout Data filed Sep. 14, 2004.

U.S. Appl. No. 60/681,095 (Nehmadi et al.) entitled Methods in Mask and Process Qualification filed May 13, 2005.

U.S. Appl. No. 60/684,360 (Nehmadi et al.) entitled Design-Based Inspection filed May 24, 2005.

U.S. Appl. No. 60/738,290 (Kulkarni et al.) entitled Methods and Systems for Utilizing Design Data in Combination With Inspection Data filed Nov. 18, 2005.

U.S. Appl. No. 60/772,418 (Kirk et al.) entitled Methods and Systems for Determining a Characteristic of a Wafer filed Feb. 9, 2006.

Verkuil et al., "A Contactless Alternative to MOS Charge Measurements by Means of a Corona-Oxide-Semiconductor (COS) Technique,"Electrochem. Soc. Extended Abstracts, 1988, vol. 88-1, No. 169, pp. 261-262.

Verkuil, "Rapid Contactless Method for Measuring Fixed Oxide Charge ASsociated with SIlicon Processing," IBM Technical Disclosure Bulletin, vol. 24, No. 6, 1981, pp. 3048-3053.

Volk et al. "Investigation of Reticle Defect Formation at DUV Lithography," 2002, BACUS Symposium on Photomask Technology.

Volk et al. "Investigation of Reticle Defect Formation at DUV Lithography," 2003, IEEE/SEMI Advanced Manufacturing Conference, pp. 29-35.

Volk et al., "Investigation of Smart Inspection of Critical Layer Reticles using Additional Designer Data to Determine Defect Significance," Proceeings of SPIE vol. 5256, 2003, pp. 489-499.

Weinberg, "Tunneling of Electrons from Si into Thermally Grown SiO2," Solid-State Electronics, 1977, vol. 20, pp. 11-18.

Weinzierl et al., "Non-Contact Corona-Based Process Control Measurements: Where We've Been, Where We're Headed," Electrochemical Society Proceedings, Oct. 1999, vol. 99-16, pp. 342-350.

Yan et al., "Printability of Pellicle Defects in DUV 0.5 um Lithography," SPIE vol. 1604, 1991, pp. 106-117.

International Search Report and Written Opinion for PCT/US2008/073706 mailed Jan. 29, 2009.

International Search Report and Written Opinion for PCT/US2008/072636 mailed Jan. 29, 2009.

International Search Report & Written Opinion, PCT/US2008/066328, mailed Oct. 1, 2009.

O'Gorman et al., "Subpixel Registration Using a Concentric Ring Fiducial," Proceedings of the International Conference on Pattern Recognition, vol. ii, Jun. 16, 1990, pp. 249-253.

\* cited by examiner

COMPUTER-IMPLEMENTED METHODS, SYSTEMS, AND COMPUTER-READABLE MEDIA FOR DETERMINING A MODEL FOR PREDICTING PRINTABILITY OF RETICLE FEATURES ON A WAFER

PRIORITY CLAIM

This application claims priority to U.S. Provisional Application No. 60/916,354 entitled "Computer-Implemented Methods, Systems, and Carrier Media for Determining a Model for Predicting Printability of Reticle Features on a Wafer," filed May 7, 2007, which is incorporated by reference as if fully set forth herein.

BACKGROUND OF THE INVENTION

1. Field of the Invention

The present invention generally relates to computer-implemented methods, systems, and computer-readable media for determining a model for predicting printability of reticle features on a wafer. Certain embodiments relate to selecting a model for predicting printability of reticle features on a wafer by comparing one or more characteristics of reticle features of simulated images generated using different models for a set of different values of exposure conditions and one or more characteristics of reticle features printed on the wafer.

2. Description of the Related Art

The following descriptions and examples are not admitted to be prior art by virtue of their inclusion within this section.

Fabricating semiconductor devices such as logic and memory devices typically includes processing a substrate such as a semiconductor wafer using a number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a semiconductor wafer and then separated into individual semiconductor devices.

Lithography is typically one of the most important processes in integrated circuit (IC) manufacturing since a pattern printed in a resist by lithography is utilized as a masking layer to transfer the pattern to additional layers on a wafer in subsequent processing steps. Therefore, the pattern that is formed on the wafer during lithography directly affects the features of the ICs that are formed on the wafer. Consequently, defects that are formed on a wafer during lithography may be particularly problematic for the IC manufacturing process. One of the many ways in which defects may be formed on the patterned wafer during lithography is by transfer of defects that are present on the reticle to the wafer. Therefore, detection and correction of defects on the reticle such as unwanted particulate or other matter is performed rather stringently to prevent as many defects on the reticle from being transferred to the wafer during lithography.

However, as the dimensions of ICs decrease and the patterns being transferred from the reticle to the wafer become more complex, marginalities in the features formed on the reticle become increasingly important. Therefore, significant efforts have been devoted to developing methods and systems that can be used to detect problems in the pattern on the reticle or in the design that will cause problems on the wafer. These efforts are relatively complex and difficult due, at least in part, to the fact that not all discrepancies or marginalities in the pattern formed on the reticle will cause errors on the wafer that will adversely affect the IC. In other words, some marginalities in the pattern formed on the reticle may not produce defects on the wafer at all or may produce defects on the wafer that will not reduce the performance characteristics of the IC. Therefore, one challenge of many in developing adequate methods and systems for qualifying a reticle pattern is to discriminate between pattern defects or marginalities that "matter" and those that do not.

One way to check a reticle pattern before the reticle is fabricated is design rule checking (DRC). However, conventional DRC operates only at the nominal process conditions or, at most, at a limited number of process conditions and/or at a limited number of points within the device. Other software-based methods for detecting design pattern defects prior to fabrication of the reticle have been proposed, and one such method is described in U.S. Patent Application Publication No. 2003/0119216A1 by Weed, which is incorporated by reference as if fully set forth herein. However, this method is designed to determine only the best focus and exposure settings and not to explore the full range of the process window conditions available for each design.

Such software methods, therefore, have several disadvantages. In particular, these software methods do not examine the full range of process window conditions thereby failing to detect process window marginalities and missing potential defects. In addition, these methods do not determine the exact focus and exposure conditions under which defects will occur thereby preventing the complete optimization of the design. The lack of complete process window information also limits the ability to implement advanced process control techniques for critical dimension control across all critical features on the device.

If the layout of a reticle design passes verification, reticle enhancement technique (RET) features may be added to the circuit layout. This step is commonly referred to as "decorating" the circuit layout. Adding the RET features to the circuit layout may be performed in a number of different ways. The RET features may include a number of different RET features such as optical proximity correction (OPC) features. The decoration may also be verified prior to reticle fabrication. Verifying the decoration may include optical rule checking (ORC). If the decorated design fails verification, the RET features in the decorated design may be altered, and the decorated design may be re-verified.

Currently, many methods for calibrating OPC feature models and OPC feature verification models involve generating a number of models and choosing the one that best simulates the wafer data. The calibration is typically performed based on data at a single focus and exposure condition or on data at focus and exposure conditions concentrated near the best focus and exposure condition. This approach has the disadvantage that the simulations may not be accurate across the entire process window and at other arbitrary focus and exposure conditions. In addition, the data is typically collected and interpreted manually in the currently used methods, which increases the probability of error in the calibration.

Accordingly, it would be desirable to develop computer-implemented methods, systems, and computer-readable media for determining a model for predicting printability of reticle features on a wafer for a set of different values of exposure conditions automatically.

SUMMARY OF THE INVENTION

The following description of various embodiments of computer-implemented methods, systems, and computer-readable media is not to be construed in any way as limiting the subject matter of the appended claims.

One embodiment relates to a computer-implemented method for determining a model for predicting printability of reticle features on a wafer. The method includes generating simulated images of the reticle features printed on the wafer using different generated models for a set of different values of exposure conditions. The method also includes determining one or more characteristics of the reticle features of the simulated images. In addition, the method includes comparing the one or more characteristics of the reticle features of the simulated images to one or more characteristics of the reticle features printed on the wafer using a lithography process. The method further includes selecting one of the different generated models as the model to be used for predicting the printability of the reticle features based on results of the comparing step.

In one embodiment, all steps of the computer-implemented method are performed automatically upon receipt of an instruction to perform the computer-implemented method. In another embodiment, predicting the printability of the reticle features includes verifying optical proximity correction features of the reticle features.

In one embodiment, the method includes generating the different generated models. In another embodiment, the method includes generating the different generated models such that each of the different generated models has one or more different parameters, different values for one or more parameters of the different generated models, or some combination thereof. In an additional embodiment, the method includes generating the different generated models such that differences in values of one or more parameters of the different generated models are greater than predetermined criteria.

In one embodiment, the different values of the exposure conditions are located in four quadrants of focus and exposure matrix space. In another embodiment, the different values of the exposure conditions are located in only a subset of four quadrants of focus and exposure matrix space. In an additional embodiment, the set of the different values of the exposure conditions includes values proximate extremes of a process window for the lithography process and best values for the exposure conditions.

In one embodiment, the method includes determining features of interest in the reticle features based on the simulated images. In another embodiment, the method includes acquiring images of the reticle features printed on the wafer at the different values of the exposure conditions and determining the one or more characteristics of the reticle features printed on the wafer at the different values of the exposure conditions using the acquired images. In an additional embodiment, the method includes determining features of interest in the reticle features based on the simulated images, determining locations on the wafer at which the features of interest are printed at the different values of the exposure conditions, and acquiring images of the reticle features printed on the wafer at the locations. In a further embodiment, the method includes acquiring images of the reticle features printed on the wafer at the different values of the exposure conditions from a metrology tool coupled to a computer system configured to perform the computer-implemented method.

In one embodiment, the method includes contouring the simulated images and images of the reticle features printed on the wafer for edge definition and determining the one or more characteristics of the reticle features of the simulated images and the reticle features printed on the wafer using the contoured images. In another embodiment, the one or more characteristics of the reticle features of the simulated images and the reticle features printed on the wafer include critical dimension.

In one embodiment, the selecting step includes determining a figure of merit for each of the different generated models based on the results of the comparing step. In another embodiment, the selecting step includes determining a composite figure of merit for each of the different generated models based on the results of the comparing step performed for two or more of the reticle features in the simulated images and in images of the reticle features printed on the wafer. In an additional embodiment, the selecting step includes determining a figure of merit for each of the different generated models and selecting the different generated model having the best figure of merit as the model to be used for predicting the printability of the reticle features.

Each of the steps of each of the embodiments of the method described above may be performed as described further herein. In addition, each of the embodiments of the method described above may include any other step(s) of any other method(s) described herein. Furthermore, each of the embodiments of the method described above may be performed by any of the systems described herein.

Another embodiment relates to a system configured to determine a model for predicting printability of reticle features on a wafer. The system includes a simulation engine configured to generate simulated images of the reticle features printed on the wafer using different generated models for a set of different values of exposure conditions. The system also includes a computer system configured to determine one or more characteristics of the reticle features of the simulated images. The computer system is also configured to compare the one or more characteristics of the reticle features of the simulated images to one or more characteristics of the reticle features printed on the wafer using a lithography process. The computer system is further configured to select one of the different generated models as the model to be used for predicting the printability of the reticle features based on results of the comparison. The system described above may be further configured as described herein.

An additional embodiment relates to a computer-readable medium that includes program instructions executable on a computer system for performing a computer-implemented method for determining a model for predicting printability of reticle features on a wafer. The computer-implemented method includes generating simulated images of the reticle features printed on the wafer using different generated models for a set of different values of exposure conditions. The method also includes determining one or more characteristics of the reticle features of the simulated images. In addition, the method includes comparing the one or more characteristics of the reticle features of the simulated images to one or more characteristics of the reticle features printed on the wafer using a lithography process. The method further includes selecting one of the different generated models as the model to be used for predicting the printability of the reticle features based on results of the comparing step.

The computer-readable medium described above may be further configured as described herein. The steps of the computer-implemented method may be further performed as described herein. In addition, the computer-implemented method for which the program instructions are executable may include any other step(s) of any other method(s) described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include one or more layers formed upon a substrate. For example, such layers may include, but are not limited to, a resist, a dielectric material, a conductive material, and a semiconductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features. Formation and processing of such layers of material may ultimately result in completed devices. Many different types of devices such as integrated circuits (ICs) may be formed on a wafer, and the term wafer as used herein is intended to encompass a wafer on which any type of device known in the art is being fabricated.

The terms "reticle" and "mask" are used interchangeably herein. A reticle generally includes a transparent substrate such as glass, borosilicate glass, and fused silica having opaque regions formed thereon in a pattern. The opaque regions may be replaced by regions etched into the transparent substrate. Many different types of reticles are known in the art, and the term reticle as used herein is intended to encompass all types of reticles.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

The embodiments described herein generally relate to lithography process condition selection and automation of modeling flow. For example, one embodiment relates to a computer-implemented method for determining a model for predicting printability of reticle features on a wafer. In some embodiments, predicting the printability of the reticle features on the wafer includes verifying optical proximity correction (OPC) features of the reticle features. For example, the model may be configured for predicting the printability of reticle features that are "decorated" or modified by reticle enhancement technique (RET) features such as OPC features or any other RET features known in the art. In this manner, the model may be configured and used for verifying that reticle features decorated with RET features such as OPC features will print correctly on the wafer. However, the method may be used for determining a model for predicting the printability of any reticle features known in the art and reticle features of any type of reticle known in the art. In addition, as described further herein, the embodiments described herein may use more than one reticle feature for model determination.

The methods described herein may also be configured and used for creating a brand new (not pre-existing) model, for refining (e.g., calibrating) a pre-existing model, and/or for calibrating a new model. Furthermore, the models determined according to embodiments described herein may include OPC models (e.g., models used to create OPC features) and models used for OPC feature verification. For example, OPC models are typically used to create OPC features by using the nominal process conditions (e.g., nominal focus and exposure conditions). The created OPC features are then verified using another model (i.e., the OPC verification model). Verification models typically verify OPC features at nominal focus and exposure conditions. However, as described herein, the verification model may be configured to check the OPC features at different values of exposure conditions to determine if the OPC features provide a reasonable process window for the lithography process.

In some embodiments, all steps of the computer-implemented method are performed automatically upon receipt of an instruction to perform the computer-implemented method. The instruction may include, for example, an instruction from a user indicating that the computer-implemented method is to be performed. The instruction may include any suitable instruction expressed in any suitable manner. In addition, the computer-implemented method may be configured to receive (and detect receipt) of the instruction in any suitable manner. Upon detection of receipt of the instruction, the computer-implemented method may automatically perform all steps of any of the embodiments described herein. In this manner, the embodiments described herein may automatically determine models for predicting wafer printability.

Figure 1:
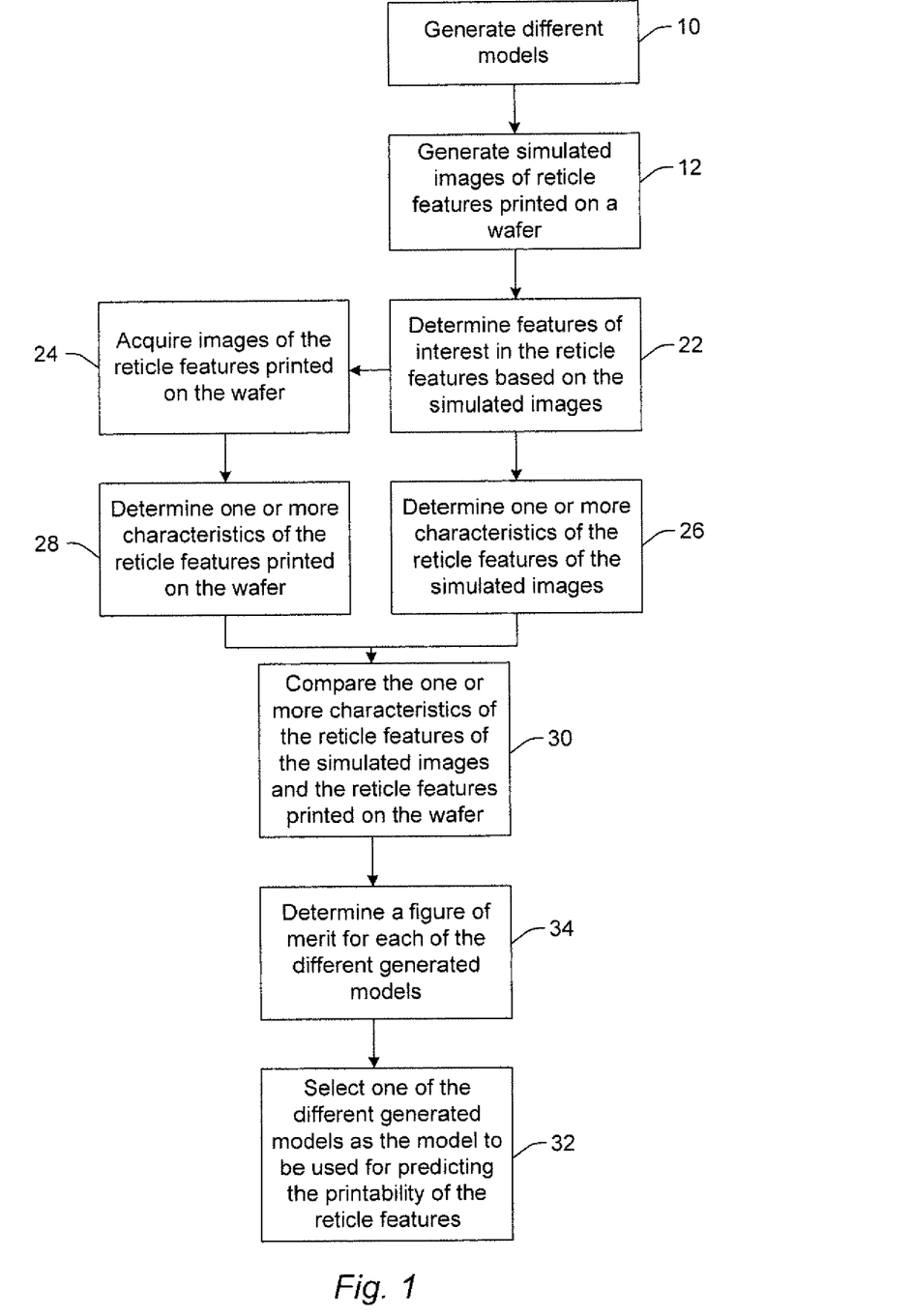
FIG. 1 is a flow chart illustrating one embodiment of a method for determining a model for predicting printability of reticle features on a wafer.

One embodiment of such a method is shown in FIG. 1. It is noted that all of the steps shown in FIG. 1 are not essential to practice of the method. One or more steps may be omitted or added to the method illustrated in FIG. 1, and the method can still be practiced within the scope of these embodiments.

In some embodiments, as shown in step 10 of FIG. 1, the method includes generating different models. In particular, the method may include generating the different generated models. As such, one embodiment of a model determination process flow includes generating multiple models. In some embodiments, the method includes generating the different generated models such that each of the different generated models has one or more different parameters, different values for one or more parameters of the different generated models, or some combination thereof. In this manner, each model may have different values for a set of parameters. In addition, the different generated models may be completely different models (i.e., not the same model with different values of one or more parameters of the model). In another embodiment, the method includes generating the different generated models such that differences in values of one or more parameters of the different generated models are greater than predetermined criteria. Therefore, the differences in parameter values for the different models may be greater than predefined criteria. The differences in the values of the one or more parameters of the different generated models may be greater than the predetermined criteria such that the models are sufficiently different from each other.

Each of the different generated models may include a resist model (e.g., a model of the resist that will be printed with the reticle features on the wafer) and a lithography model (e.g., a model of the optical parameters of an exposure tool that will be used to print the reticle on the wafer or a "scanner model" and a model of other process steps involved in the lithography process such as develop and post exposure bake). The different generated models may also include models for any other material or process involved in printing the reticle features on a wafer (e.g., a reticle manufacturing model).

As shown in step 12 of FIG. 1, the method includes generating simulated images of reticle features printed on a wafer. In particular, the method includes generating simulated images of the reticle features printed on the wafer using the different generated models for a set of different values of exposure conditions. In this manner, the method may include simulating what the expected printable pattern on the wafer (or wafer data) will be using each model. In addition, the simulated images illustrate how the reticle features will be printed on a wafer at different values of exposure conditions for a lithography process.

Figure 2:
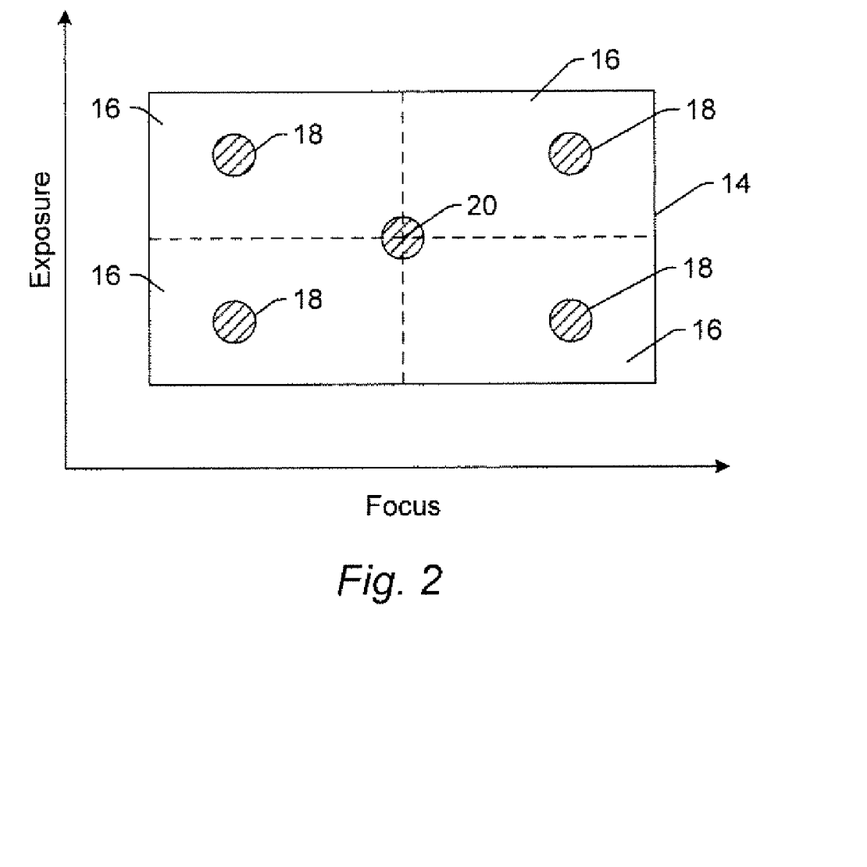
FIG. 2 is a schematic diagram illustrating one embodiment of different values of exposure conditions for which simulated images of reticle features are generated using different generated models.

The exposure conditions may include focus and dose. For example, in one embodiment, the different values of the exposure conditions are located in four quadrants of focus and exposure matrix space. FIG. 2 illustrates one example of focus and exposure matrix space 14. In particular, as shown in FIG. 2, focus and exposure matrix space 14 can be illustrated by plotting focus along the x axis of a graph and plotting exposure along the y axis of the graph (or vice versa). In addition, focus and exposure matrix space 14 may vary depending on the reticle features and the lithography process that will be used to print the reticle features on wafers. For example, focus and exposure matrix space 14 may be equal to the process window for a lithography process.

As further shown in FIG. 2, focus and exposure matrix space 14 may be separated into four quadrants 16. Different values 18 of the exposure conditions used in the embodiments described herein may be located in the four quadrants of the focus and exposure matrix space. In particular, each of the different values may be located in one of the four quadrants of the focus and exposure matrix space. In addition, although the different values are shown in FIG. 2 located at particular positions within the four quadrants of the focus and exposure matrix space, the different values may be located at any suitable positions within the four quadrants. In this manner, instead of using a single focus and exposure condition as in currently used methods, the embodiments described herein may use data taken in four quadrants of the focus and exposure matrix space (i.e., negative focus, low exposure; negative focus, high exposure; positive focus, low exposure; and positive focus, high exposure) to determine a model for predicting printability of reticle features on a wafer.

In another embodiment, the different values of the exposure conditions are located in only a subset of four quadrants 16 of focus and exposure matrix space 14. For example, the different values may be located in two or more of the four quadrants of the focus and exposure matrix space. In particular, although a subset or superset of the conditions in the four quadrants described above can be used, consideration may be given to the fact that focus is not a symmetric operation. In other words, a focus of 100 nm on the positive side of the best focus condition does not produce the same aerial image and wafer pattern as 100 nm on the negative side of the best focus condition. However, if the models differ more than the asymmetry in focus, then different values in a subset of the four quadrants may be used to produce sufficient information for determining a model for predicting printability of reticle features on a wafer.

In an additional embodiment, the set of the different values of the exposure conditions includes values proximate extremes of a process window for the lithography process and best values for the exposure conditions. For instance, focus and exposure matrix space 14 may define the process window for a lithography process. The extremes of the process window may include at least the four quadrant conditions of the focus and exposure matrix space. In this manner, different values 18 of the exposure conditions may include values proximate the extremes of the process window, and values 20 may be the best values (e.g., nominal or reference values) for the exposure conditions. As such, the expected printable pattern on the wafer may be simulated in the embodiments described herein using each model and focus and exposure conditions that are near the extremes of the process window as well as at best focus and exposure. In this manner, data may be collected at the best focus and exposure conditions and near the extremes of the process window in the four quadrants surrounding the best focus and exposure conditions. Moreover, the different values of the exposure conditions may, in some instances, exceed the process window to any suitable degree. The degree to which the different values exceed the process window may be selected by a user or selected by the embodiments described herein (e.g., automatically). Furthermore, although the exposure conditions may preferably include focus and exposure, the exposure conditions may also include any other conditions of the lithography process such as the type of illumination (e.g., annular, quadrapole, etc.) that may be used to print the reticle features.

In some embodiments, as shown in step 22 of FIG. 1, the method includes determining features of interest in the reticle features based on the simulated images. In this manner, the method may determine the features of interest on the wafer using the simulated images or simulated data. The method shown in FIG. 1 may, therefore, be used as an automated process flow for model determination if features of interest are unknown. Determining the features of interest may be performed by comparing the simulated images to a design database for the reticle features to determine which of the reticle features may produce defects on the wafer. For example, reticle features of the simulated images that are significantly different from the reticle features as designed may be determined to be potential defects on the wafer. In addition, if reticle features of the simulated images generated by more than one of the different models are determined to be significantly different than the as-designed reticle features, these reticle features may have a higher probability of producing defects on the wafers and therefore may be selected for use as the features of interest. Therefore, such reticle features may be more sensitive to different exposure conditions and as such may be particularly good features for use in evaluating and comparing the performance of different models. Furthermore, reticle features that are known to be relatively sensitive to different values of exposure conditions (e.g., reticle features that tend to exhibit line end shortening (LES) for different values of exposure conditions) may be selected as the features of interest that are used to evaluate and compare the different models. Other suitable reticle features may include test features, which may be identified by comparing one or more characteristics of different reticle features (e.g., test features may have different characteristics such as position and/or arrangement in the reticle field compared to device features).

In one embodiment, the method includes acquiring images of the reticle features printed on the wafer, as shown in step 24 of FIG. 1. The images of the reticle features printed on the wafer may be acquired in a number of different manners. For example, in one embodiment, the method includes acquiring images of the reticle features printed on the wafer at the different values of the exposure conditions from a metrology tool coupled to a computer system configured to perform the computer-implemented method. In this manner, a system configured to perform the computer-implemented method may be configured to acquire the images from a different system that generates the images of the reticle features printed on the wafer. In one such example, the computer-implemented method may include sending a request for the images to the system that generates the images. The requested images may then be received by the system configured to perform the computer-implemented method. The system that generates the images of the reticle features printed on the wafer may include any suitable system known in the art such as a scanning electron microscope (SEM) and an atomic force microscope (AFM). As such, the method may include collecting wafer images using a SEM or AFM.

In some embodiments, the images of the reticle features printed on the wafer may be acquired at locations on the wafer at which features of interest in the reticle features are printed. For example, as shown in step 22 of FIG. 1 described further above, the method may include determining features of interest in the reticle features based on the simulated images. In one such embodiment, the method includes determining locations on the wafer at which the features of interest are printed at the different values of the exposure conditions. Therefore, the method may also include collecting wafer images of the reticle features at the same focus and exposure conditions that were used to perform the simulation. For example, the locations on the wafer at which the features of interest are printed may be determined based on the position of the features of interest on the reticle, the layout of the reticle fields on the wafer, the values of the exposure conditions at which each of the reticle fields in the layout is printed on the wafer, and any other suitable information. In this manner, acquiring the images of the reticle features printed on the wafer as shown in step 24 of FIG. 1 may be performed at the locations on the wafer at which the features of interest are printed at the different values of the exposure conditions. In addition, the coordinates of the locations on the wafer at which the images are acquired may be provided by simulation software (or a simulation engine configured as described further herein).

As shown in step 26 of FIG. 1, the method includes determining one or more characteristics of the reticle features of the simulated images. In this manner, the method may include extracting data from the simulated images. In some embodiments, as shown in step 28 of FIG. 1, the method includes determining one or more characteristics of the reticle features printed on the wafer. As such, the method may include extracting data from the wafer images. For example, in one embodiment, step 24 of FIG. 1 includes acquiring images of the reticle features printed on the wafer at the different values of the exposure conditions, and step 28 of FIG. 1 includes determining the one or more characteristics of the reticle features printed on the wafer at the different values of the exposure conditions using the acquired images. For full characterization of the different generated models over an entire process window, the one or more characteristics of the simulated images and the acquired images (i.e., the wafer data) throughout the entire process window may be measured or determined as described further herein. In other embodiments, the one or more characteristics of the reticle features printed on the wafer may be determined by the system used to acquire the images of the reticle features printed on the wafer. In this manner, a system configured to perform the method embodiments described herein may be configured to acquire the one or more characteristics of the reticle features printed on the wafer from another system.

The one or more characteristics of the reticle features of the simulated images and the acquired images may be determined in any suitable manner using any suitable algorithm and/or method. For example, in one embodiment, the method includes contouring the simulated images and images of the reticle features printed on the wafer for edge definition and determining the one or more characteristics of the reticle features of the simulated images and the reticle features printed on the wafer using the contoured images. In this manner, extracting the relevant data from the images may include contouring the images with well-defined algorithm(s) for edge definition.

The one or more characteristics of the reticle features of the simulated images and the acquired images may include any suitable characteristic(s) of the reticle features. For example, in one embodiment, the one or more characteristics of the reticle features of the simulated images and the reticle features printed on the wafer include critical dimension (CD). In addition, the method may include extracting the relevant data from the images using CD measurements of 1.5D features or 2D features. (1D features may include reticle features such as lines or spaces, while 2D features may include reticle features having a closed boundary (e.g., such that the entire boundary can be traced from one point on the boundary and back to the same point). In contrast, 1.5D features may include features such as LES or features typically used to measure overlay. In this manner, 1.5D features may include a positional relationship between two different features). In one embodiment, therefore, the method may include using 2D data from the entire process window for model determination.

As shown in step 30 of FIG. 1, the method includes comparing the one or more characteristics of the reticle features of the simulated images and the reticle features printed on the wafer. In particular, the method includes comparing the one or more characteristics of the reticle features of the simulated images to one or more characteristics of the reticle features printed on the wafer using a lithography process. Comparing the one or more characteristics of the reticle features of the simulated images and the acquired images may be performed in any suitable manner using any suitable algorithm(s) and/or method(s).

In one example, characteristic(s) of the images may be compared on a point-by-point basis across the images, and differences between the characteristic(s) may be identified using, for example, algorithms. The algorithms that are used for the comparing step may include algorithms that are the same as, or substantially similar to, those used in inspection.

Therefore, difference detection may be performed by comparing characteristic(s) of the images. Any region in the simulated images that varies from the corresponding region in the acquired image by more than a threshold value may be flagged as a difference. All of the algorithmic tools used in physical inspection systems can be used in this comparing step including applying multiple algorithmic detectors based on different smoothing filters applied to varying numbers of nearest neighbor pixels and detecting single edge misplacements (CD errors) and/or dual edge misplacements (registration errors).

The comparing step may have the same tuning capability as defect detection algorithms used for physical inspection tools. In particular, the algorithms that are used for the comparing step described herein may be configured such that the sensitivity of the algorithms can be optimized to detect differences for some reticle features that will impact device performance and yield. In one such example, the sensitivity of the algorithms may be altered from feature-to-feature based on one or more as-designed characteristics of the features (e.g., dimensions, criticality, etc.). Therefore, the model selected as described further herein may be more accurate for predicting the printability of reticle features that are more relevant to device performance and yield than other reticle features.

The characteristics of the reticle features are preferably compared for the simulated images and the acquired images generated for the same values of the exposure conditions. In other words, the comparison may be performed on an exposure condition-to-exposure condition basis. In this manner, the method may include using multiple values of exposure conditions for model determination. In addition, the method may include using multiple reticle features as described above and multiple values of exposure conditions for model determination. Output of the comparing step may include coordinates of the differences between the simulated and acquired images, portions of the simulated images (and possibly acquired images) corresponding to the positions of the differences, a database clip of the as-designed reticle features, the severity (e.g., the magnitude) of the differences detected between the different images, or some combination thereof.

The method shown in FIG. 1 also includes selecting one of the different generated models as the model to be used for predicting the printability of the features, as shown in step 32. In particular, the method includes selecting one of the different generated models as the model to be used for predicting the printability of the reticle features based on results of the comparing step (e.g., step 30 shown in FIG. 1). Preferably, the model that produces the least differences between the one or more characteristics of the reticle features of the simulated images and the one or more characteristics of the reticle features printed on the wafer is selected as the model to be used for predicting the printability of the reticle features. In this manner, the model that is to be used for predicting the printability of the reticle features may be selected based on how well the simulated reticle features generated by the models match the printed reticle features on the wafer.

In addition, since more than one reticle feature and more than one value of exposure conditions are used to select the model to be used for predicting the printability of the reticle features, different generated models may have different minimum differences depending on the reticle feature and exposure condition. In other words, local minimum differences (for different features and different exposure conditions) may be exhibited by different models. However, the model that is selected for use as the model for predicting the printability of the reticle features may be the model that is determined to have a global minimum across reticle features and across exposure conditions. In this manner, the model that is selected for use as the model for predicting the printability of the reticle features may not necessarily be the "best fit" model, but may be the model that provides the most accurate results across a range of reticle features and exposure conditions.

In some embodiments, the method includes determining a figure of merit for each of the different models, as shown in step 34 of FIG. 1. For example, in one embodiment, selecting one of the different generated models in step 32 includes determining a figure of merit for each of the different generated models based on the results of the comparing step (step 30 of FIG. 1). In this manner, the method may include constructing a figure of merit from the simulation and instrument data (e.g., the acquired images). In particular, the method may include constructing the figure of merit from differences between simulated and wafer images for each model.

In one option, the figure of merit may be constructed based on the difference in area between simulated and actual features. In another option, the figure of merit may be constructed by combining multiple CD measurements and analyzing the multiple CD measurements either by minimizing the chi-square difference or the maximum CD difference between many points on the simulation and actual data. For example, the chi-square difference for 1D data may include the root mean squared (rms) for the data. In contrast, the chi-square difference for 2D data may be the edge placement error (EPE). In addition, for 2D data, the points on the simulated and actual data at which the maximum CD or other difference is determined may include many different slices across the data (e.g., the CD error can be determined in one dimension of the feature at various points across the orthogonal dimension of the feature).

In another embodiment, selecting one of the different generated models includes determining a composite figure of merit for each of the different generated models based on the results of the comparing step (step 30 of FIG. 1) performed for two or more of the reticle features in the simulated images and in images of the reticle features printed on the wafer. For example, the above described options can be expanded to form composite figure(s) of merit based on multiple features. In an additional embodiment, the selecting step includes determining a figure of merit for each of the different generated models and selecting the different generated model having the best figure of merit as the model to be used for predicting the printability of the reticle features. In this manner, the method may include selecting the model with the best figure of merit as the model to be used for predicting the printability of the reticle features on the wafer.

The method may also include performing one or more additional steps based on the results of the comparing step (step 30 of FIG. 1). The one or more steps may include, for example, rejection of one or more of the models, selection of additional simulations to be performed using the models, adjustment of one or more parameters of one or more of the different generated models, selection of additional different models to be generated and evaluated as described herein, or some combination thereof.

The embodiments described herein have a number of advantages over currently used methods and systems for generating models for OPC features and OPC feature verification. For instance, as described herein, the different generated models may be evaluated across a number of different values of exposure conditions. Therefore, the model that is selected to be used for predicting printability of the reticle features on a wafer may advantageously be the best model (out of those evaluated) for predicting the printing of the reticle features across the largest possible range of values of the exposure conditions. In addition, as described herein, the different generated models may be evaluated across a number of different reticle features. As such, the model that is selected to be used for predicting the printability of the reticle features on a wafer may advantageously be the best model (out of those evaluated) for predicting the printing of a number of different reticle features.

The method may also include storing results of the selecting step (step 32 of FIG. 1) in a storage medium. The results of the selecting step may include any of the results described herein. In addition, the storing step may include storing results of the selecting step in addition to any other results of any steps of any method embodiments described herein. The results may be stored in any manner known in the art. In addition, the storage medium may include any storage medium described herein or any other suitable storage medium known in the art. After the results have been stored, the results can be accessed in the storage medium and used by any of the method or system embodiments as described herein, formatted for display to a user, used by another software module, method, or system, etc. Furthermore, the results may be stored "permanently," "semi-permanently," temporarily, or for some period of time. For example, the storage medium may be random access memory (RAM), and the results of the selecting step may not necessarily persist indefinitely in the storage medium.

The embodiment of the method shown in FIG. 1 may include any other step(s) of any other method(s) described herein. In addition, the embodiment of the method shown in FIG. 1 may be performed by any of the system embodiments described herein.

Figure 3:
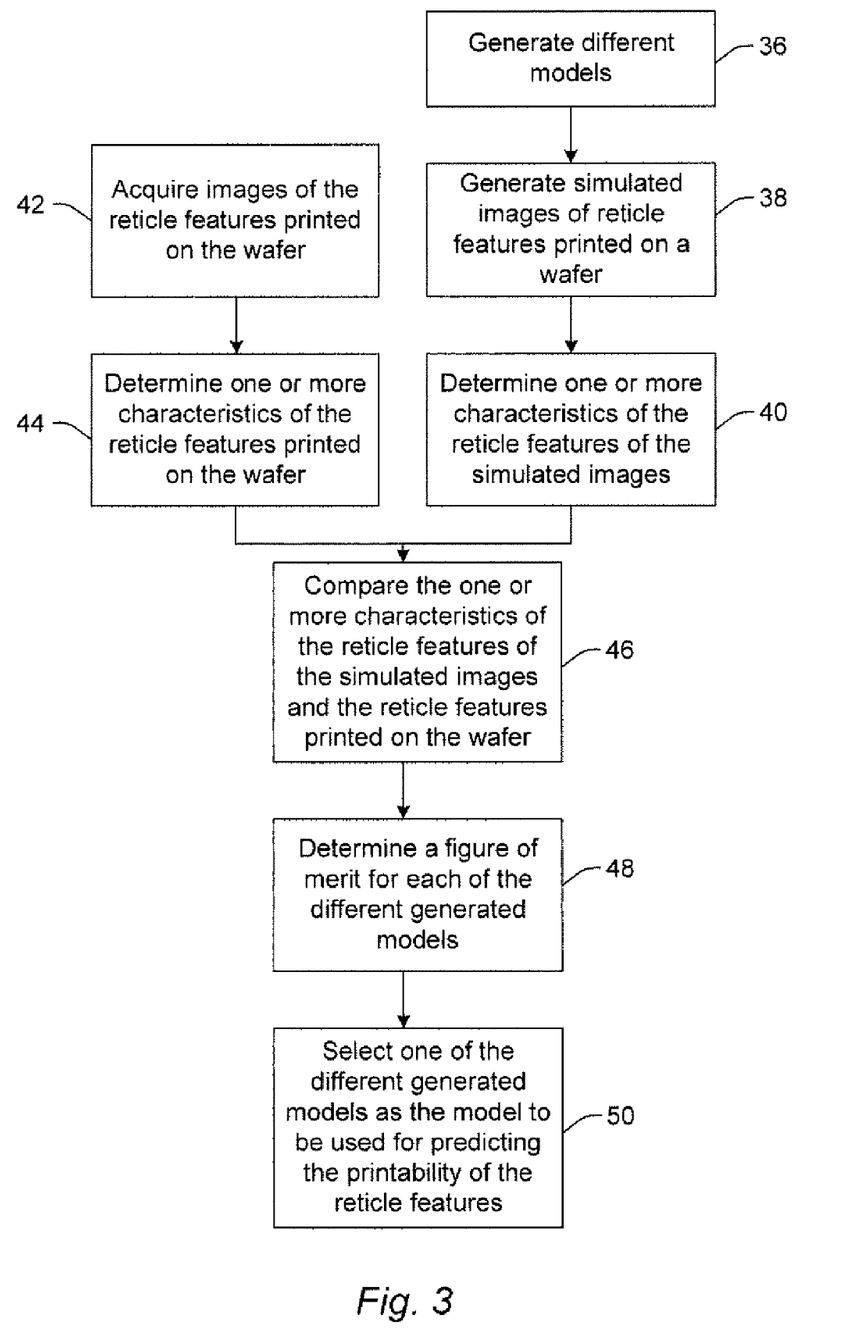
FIG. 3 is a flow chart illustrating another embodiment of a method for determining a model for predicting printability of reticle features on a wafer.

The method shown in FIG. 1 may include determining the features of interest in the reticle features as described further above. Therefore, the method shown in FIG. 1 may be particularly useful for instances in which the features of interest in the reticle features are not predetermined or known a priori before the method is performed. If the features of interest have been predetermined or are known before the method is performed, the embodiment of a computer-implemented method for determining a model for predicting printability of reticle features on a wafer shown in FIG. 3 may be used. In particular, the method shown in FIG. 3 may be used as an automated process flow of model determination if features of interest are known. It is noted that all of the steps shown in FIG. 3 are not essential to practice of the method. One or more steps may be omitted or added to the method illustrated in FIG. 3, and the method can still be practiced within the scope of these embodiments.

In some embodiments, the method shown in FIG. 3 includes generating different models, as shown in step 36. Generating the different models may be performed as described herein. This method also includes generating simulated images of reticle features printed on a wafer, as shown in step 38, which may be performed as described herein. In addition, this method includes determining one or more characteristics of the reticle features of the simulated images, as shown in step 40, which may be performed as described herein. In some embodiments, the method includes acquiring images of the reticle features printed on the wafer, as shown in step 42, which may be performed as described herein. The simulated images and the acquired images include images of the features of interest in the reticle features, which in this embodiment are known prior to performing the method. Therefore, unlike some embodiments of the method shown in FIG. 1, the embodiment of the method shown in FIG. 3 does not include determining features of interest in the reticle features based on the simulated images.

As shown in FIG. 3, in some embodiments, this method includes determining one or more characteristics of the reticle features printed on the wafer, as shown in step 44, which may be performed as described herein. In addition, this method includes comparing the one or more characteristics of the reticle features of the simulated images and the reticle features printed on the wafer, as shown in step 46, which may be performed as described herein. In some embodiments, the method shown in FIG. 3 includes determining a figure of merit for each of the different models, as shown in step 48, which may be performed as described herein. The method shown in FIG. 3 further includes selecting one of the different generated models as the model to be used for predicting the printability of the reticle features, as shown in step 50, which may be performed as described herein. The embodiment of the method shown in FIG. 3 may include any other step(s) of any other method(s) described herein. In addition, the method may be performed by any of the system embodiments described herein.

Figure 4:
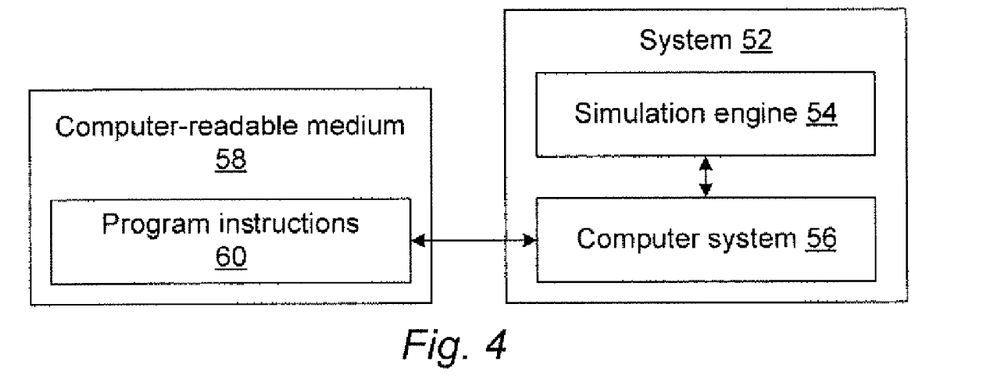
FIG. 4 is a block diagram illustrating one embodiment of a system configured to determine a model for predicting printability of reticle features on a wafer and one embodiment of a computer-readable medium that includes program instructions executable on a computer system for performing one or more computer-implemented method embodiments described herein.

FIG. 4 illustrates one embodiment of a system configured to determine a model for predicting printability of reticle features on a wafer. The model for predicting printability of reticle features on a wafer may include any of the models described herein. The reticle features may include any of the reticle features described herein. As shown in FIG. 4, system 52 includes simulation engine 54 configured to generate simulated images of the reticle features printed on the wafer using different generated models for a set of different values of exposure conditions. The simulation engine may be configured to generate the simulated images as described further herein. The set of different values of the exposure conditions may include any of the different values described herein. In addition, the different generated models may be generated as described herein. The simulation engine may have any suitable configuration known in the art.

The system shown in FIG. 4 also includes computer system 56. The computer system is configured to determine one or more characteristics of the reticle features of the simulated images. The computer system may be configured to determine the one or more characteristics of the reticle features of the simulated images as described further herein. The one or more characteristics of the reticle features of the simulated images may include any of the characteristic(s) described herein. The computer system is also configured to compare the one or more characteristics of the reticle features of the simulated images to one or more characteristics of the reticle features printed on the wafer using a lithography process. The computer system may be configured to compare the one or more characteristics of the reticle features of the simulated images to one or more characteristics of the reticle features printed on the wafer as described further herein. In addition, the computer system is configured to select one of the different generated models as the model to be used for predicting the printability of the reticle features based on results of the comparison. The computer system may be configured to select one of the different generated models as the model to be used for predicting the printability of the reticle features as described further herein.

The computer system may include any suitable computer system known in the art. For example, computer system 56 may take various forms, including a personal computer system, mainframe computer system, workstation, image computer, parallel processor, or any other device known in the art. In general, the term "computer system" may be broadly defined to encompass any device having one or more processors, which executes instructions from a memory medium.

The system shown in FIG. 4 may be configured to perform any other step(s) of any other method(s) described herein. For example, in some embodiments, the computer system is configured to generate the different generated models, which may be performed as described further herein. In another embodiment, the computer system is configured to determine features of interest in the reticle features based on the simulated images. The computer system may be configured to determine the features of interest in the reticle features as described further herein. In an additional embodiment, the computer system is configured to acquire images of the reticle features printed on the wafer at the different values of the exposure conditions and to determine the one or more characteristics of the reticle features printed on the wafer at the different values of the exposure conditions using the acquired images. The images of the reticle features printed on the wafer may be acquired by the computer system as described herein. The one or more characteristics of the reticle features printed on the wafer may be determined by the computer system as described herein. In a further embodiment, the computer system is configured to determine locations on the wafer at which the features of interest are printed at the different values of the exposure conditions and to acquire images of the reticle features printed on the wafer at the locations, which may be performed by the computer system as described herein.

In some embodiments, the computer system is configured to contour the simulated images and images of the reticle features printed on the wafer for edge definition and to determine the one or more characteristics of the reticle features of the simulated images and the reticle features printed on the wafer using the contoured images. The computer system may be configured to perform such contouring and determining as described further herein. In an additional embodiment, the computer system is configured to select the model to be used for predicting the printability of the reticle features by determining a figure of merit and/or a composite figure of merit, which may be determined as described further herein. System 52, simulation engine 54, and computer system 56 may be further configured as described herein.

As described above, all steps of the computer-implemented method may be performed automatically upon receipt of an instruction to perform the computer-implemented method. In this manner, the entire process may be automated. In one particular example, a system configured to acquire images of the reticle features printed on the wafer may include a SEM or an AFM. The SEM or AFM may be configured to automatically acquire the data (e.g., take the images) and pass the images to a computer system such as that described herein. The computer system can be configured to automatically generate the simulated images for each model. The computer system can also be configured to automatically compare the SEM/AFM images with the simulated images (e.g., using an algorithm that calculates the edge differences between the digitized data of the two types of images). In this manner, the system may be configured for automation of the process flow by linking to the SEM and/or AFM with automatic data comparison. The figure of merit may be generated by combining the actual and simulated data. The computer system may be configured to then automatically decide which model is best.

FIG. 4 also illustrates one embodiment of computer-readable medium 58 that includes program instructions 60 executable on computer system 56 for performing a computer-implemented method for determining a model for predicting printability of reticle features on a wafer. The method includes generating simulated images of the reticle features printed on the wafer using different generated models for a set of different values of exposure conditions, which may be performed as described herein. The method also includes determining one or more characteristics of the reticle features of the simulated images, which may be performed as described herein. In addition, the method includes comparing the one or more characteristics of the reticle features of the simulated images to one or more characteristics of the reticle features printed on the wafer using a lithography process, which may be performed as described herein. The method further includes selecting one of the different generated models as the model to be used for predicting the printability of the reticle features based on results of the comparing step, which may be performed as described herein. The method for which program instructions 60 are executable on computer system 56 may include any other step(s) of any other method(s) described herein. Computer-readable medium 58, program instructions 60, and computer system 56 may be further configured as described herein.

Program instructions 60 implementing methods such as those described herein may be transmitted over or stored on computer-readable medium 58. The computer-readable medium may be a transmission medium such as a wire, cables, or wireless transmission link. The computer-readable medium may also be a storage medium such as a read-only memory, a random access memory, a magnetic or optical disk, or a magnetic tape.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

Further modifications and alternative embodiments of various aspects of the invention may be apparent to those skilled in the art in view of this description. For example, computer-implemented methods, systems, and computer-readable media for determining a model for predicting printability of reticle features on a wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for determining a model for predicting printability of reticle features on a wafer, comprising:
   generating different generated models;
   generating simulated images of the reticle features printed on the wafer using the different generated models for a set of different values of exposure conditions;
   determining one or more characteristics of the reticle features of the simulated images;
   comparing the one or more characteristics of the reticle features of the simulated images to one or more characteristics of the reticle features printed on the wafer using a lithography process; and selecting one of the different generated models as the model to be used for predicting the printability of the reticle features based on results of the comparing step, wherein generating the different generated models, generating the simulated images, said determining, said comparing, and said selecting are performed using a computer system.

2. The method of claim 1, wherein all steps of the computer-implemented method are performed automatically upon receipt of an instruction to perform the computer-implemented method.

3. The method of claim 1, wherein said predicting the printability of the reticle features comprises verifying optical proximity correction features of the reticle features.

4. The method of claim 1, wherein generating the different generated models is performed such that each of the different generated models has one or more different parameters, different values for one or more parameters of the different generated models, or some combination thereof.

5. The method of claim 1, wherein generating the different generated models is performed such that differences in values of one or more parameters of the different generated models are greater than predetermined criteria.

6. The method of claim 1, wherein the different values of the exposure conditions are located in four quadrants of focus and exposure matrix space.

7. The method of claim 1, wherein the different values of the exposure conditions are located in only a subset of four quadrants of focus and exposure matrix space.

8. The method of claim 1, wherein the set of the different values of the exposure conditions comprises values proximate extremes of a process window for the lithography process and best values for the exposure conditions.

9. The method of claim 1, further comprising determining features of interest in the reticle features based on the simulated images.

10. The method of claim 1, further comprising acquiring images of the reticle features printed on the wafer at the different values of the exposure conditions and determining the one or more characteristics of the reticle features printed on the wafer at the different values of the exposure conditions using the acquired images.

11. The method of claim 1, further comprising determining features of interest in the reticle features based on the simulated images, determining locations on the wafer at which the features of interest are printed at the different values of the exposure conditions, and acquiring images of the reticle features printed on the wafer at the locations.

12. The method of claim 1, further comprising acquiring images of the reticle features printed on the wafer at the different values of the exposure conditions from a metrology tool coupled to the computer system configured to perform the computer-implemented method.

13. The method of claim 1, further comprising contouring the simulated images and images of the reticle features printed on the wafer for edge definition and determining the one or more characteristics of the reticle features of the simulated images and the reticle features printed on the wafer using the contoured images.

14. The method of claim 1, wherein the one or more characteristics of the reticle features of the simulated images and the reticle features printed on the wafer comprise critical dimension.

15. The method of claim 1, wherein said selecting comprises determining a figure of merit for each of the different generated models based on the results of said comparing.

16. The method of claim 1, wherein said selecting comprises determining a composite figure of merit for each of the different generated models based on the results of said comparing performed for two or more of the reticle features in the simulated images and in images of the reticle features printed on the wafer.

17. The method of claim 1, wherein said selecting comprises determining a figure of merit for each of the different generated models and selecting the different generated model having the best figure of merit as the model to be used for said predicting the printability of the reticle features.

18. A system configured to determine a model for predicting printability of reticle features on a wafer, comprising:
   a simulation engine configured to generate simulated images of the reticle features printed on the wafer using different generated models for a set of different values of exposure conditions; and
   a computer system configured to:
      generate the different generated models prior to generation of the simulated images by the simulation engine
      determine one or more characteristics of the reticle features of the simulated images;
      compare the one or more characteristics of the reticle features of the simulated images to one or more characteristics of the reticle features printed on the wafer using a lithography process; and
      select one of the different generated models as the model to be used for predicting the printability of the reticle features based on results of the comparison.

19. A non-transitory computer-readable medium, comprising program instructions executable on a computer system for performing a computer-implemented method for determining a model for predicting printability of reticle features on a wafer, wherein the computer-implemented method comprises:
   generating different generated models
   generating simulated images of the reticle features printed on the wafer using the different generated models for a set of different values of exposure conditions;
   determining one or more characteristics of the reticle features of the simulated mages;
   comparing the one or more characteristics of the reticle features of the simulated images to one or more characteristics of the reticle features printed on the wafer using a lithography process; and
   selecting one of the different generated models as the model to be used for predicting the printability of the reticle features based on results of the comparing step.

* * * * *